United States Patent
Locker et al.

(10) Patent No.: US 7,492,044 B2
(45) Date of Patent: Feb. 17, 2009

(54) SYSTEM AND METHOD FOR DECREASING STRESS ON SOLDER HOLDING BGA MODULE TO COMPUTER MOTHERBOARD

(75) Inventors: Howard Jeffrey Locker, Cary, NC (US); Daryl Carvis Cromer, Apex, NC (US); Tin-Lup Wong, Chapel Hill, NC (US)

(73) Assignee: Lenovo (Singapore) Pte. Ltd. (SG)

( * ) Notice: Subject to any disclaimer, the term of this patent is extended or adjusted under 35 U.S.C. 154(b) by 246 days.

(21) Appl. No.: 11/245,375

(22) Filed: Oct. 6, 2005

(65) Prior Publication Data

US 2007/0090525 A1  Apr. 26, 2007

(51) Int. Cl.
*H01L 23/04* (2006.01)

(52) U.S. Cl. .................. 257/730; 257/678; 257/669

(58) Field of Classification Search ............ 257/669, 257/678, 730; 438/123
See application file for complete search history.

(56) References Cited

U.S. PATENT DOCUMENTS

| | | | |
|---|---|---|---|
| 5,195,023 A * | 3/1993 | Manzione et al. ............ 361/728 |
| 5,393,234 A | 2/1995 | Yamada et al. ............... 439/62 |
| 5,445,240 A | 8/1995 | Cunningham, Edward V. et al. ............................................. 180/132 |
| 5,943,597 A * | 8/1999 | Kleffner et al. ............. 438/613 |
| 6,325,643 B1 | 12/2001 | Ohtsuki et al. .............. 439/82 |
| 6,426,154 B1 | 7/2002 | Naba et al. .................. 428/620 |
| 6,682,354 B2 | 1/2004 | Carson et al. ................ 439/63 |
| 6,773,269 B1 | 8/2004 | Downes ....................... 439/75 |
| 6,864,423 B2 | 3/2005 | Tan et al. .................... 174/52.2 |
| 6,927,344 B1 | 8/2005 | Gall et al. .................... 174/254 |
| 6,943,502 B2 | 9/2005 | Yamanaka et al. ......... 315/224 |
| 6,979,595 B1 * | 12/2005 | James et al. ................ 438/115 |
| 7,285,856 B2 * | 10/2007 | Ooi et al. .................... 257/739 |
| 2002/0074147 A1 | 6/2002 | Tan et al. .................... 174/52.4 |
| 2003/0089969 A1 * | 5/2003 | Hashimoto .................. 257/669 |
| 2004/0070721 A1 | 4/2004 | Tsubokura et al. ......... 349/149 |
| 2005/0190531 A1 | 9/2005 | Gall et al. .................... 361/600 |

FOREIGN PATENT DOCUMENTS

| | | |
|---|---|---|
| EP | 0590429 | 4/1994 |
| JP | 4340794 | 11/1972 |
| JP | 5335696 | 12/1993 |
| JP | 2001094000 | 4/2001 |

OTHER PUBLICATIONS

"Motherboard". Oxford English Dictionary Online. Draft Revision Dec. 2002. Mar. 13, 2007. Keyword: motherboard. http://dictionary.oed.com/cgi/entry/00316365?single=1&query_type=word&word&queryword=mother-board&first=1&max_to_show=10.*

* cited by examiner

*Primary Examiner*—Douglas M Menz
(74) *Attorney, Agent, or Firm*—John L. Rogitz

(57) ABSTRACT

Mechanical stress on solder joints that hold BGA modules to computer motherboards is reduced by adding to the motherboard a topmost layer, and forming V-shaped channels into the layer next to the BGA module so that stress is shielded from the BGA module and its solder joints.

14 Claims, 2 Drawing Sheets

SYSTEM AND METHOD FOR DECREASING STRESS ON SOLDER HOLDING BGA MODULE TO COMPUTER MOTHERBOARD

FIELD OF THE INVENTION

The present invention relates generally to decreasing mechanical stress on elements of computer motherboards.

BACKGROUND OF THE INVENTION

Components are mounted to computer motherboards in various ways. One advantageous way is by using ball grid array (BGA) technology, wherein a BGA module is provided with small solder dots or balls arranged in concentric rectangles that both mechanically attach the module to the board and that establish electrical connectivity between the module and board. This direct mounting allows for a smaller chip size which in turn allows for greater logic densities because of the larger amount of chips that can be mounted on the module, as well as better heat dissipation than with traditionally packaged chips. BGA modules are often used in mobile applications where conventional pin grid array (PGA) chips would take up too much space due to the length of the pins used to connect the chips to the circuit board.

As recognized by the present invention, minimizing failed solder joints between BGA modules and the motherboard is becoming increasingly complicated. For one thing, mobile devices are much more likely to dropped or banged or otherwise mechanically stressed, which can lead to solder joint failure. For another thing, evolving regulatory standards can sometimes dictate the use of relatively weaker solder, e.g., lead-free solder. Having made these critical observations, the solution herein is provided.

SUMMARY OF THE INVENTION

A system includes a circuit board such as a computer motherboard having a topmost layer and one or more modules, such as ball grid array (BGA) modules that are connected to the circuit board by plural solder joints. A stress relief channel, preferably a V-channel, is formed into the topmost layer of the circuit board adjacent the BGA module to impede mechanical stress from reaching at least portions of the BGA module.

Plural V-channels may be used, one between the BGA module and each bordering edge of the circuit board. The V-channel may define opposed walls that are oblique to each other and that extend down toward each other through the topmost layer.

In one non-limiting implementation, the topmost layer bears electrical leads in regions that are between the BGA module and the circuit board. In another implementation, the topmost layer is substantially devoid of electrical connectors. In this latter embodiment, the topmost layer is not formed in regions between the BGA module and the circuit board. In either embodiment, electrical connectivity with the BGA module is achieved.

In another aspect, a method includes establishing a topmost layer on a circuit board, and forming at least one stress relief channel into the topmost layer near an edge of the circuit board. The method contemplates mounting at least one module on the circuit board. The stress relief channel is disposed between the module and the edge of the circuit board, and no modules are mounted between the stress relief channel and the edge. In this way, mechanical stress that would otherwise propagate (e.g., from the edge of the motherboard) to solder joints that hold the module to the circuit board is shielded from the solder joints by the stress relief channel.

In yet another aspect, a mobile computing device includes a portable housing, a motherboard in the housing, and a module mounted on the motherboard at plural solder joints. Channel means are juxtaposed with the motherboard for channeling stress away from the solder joints.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
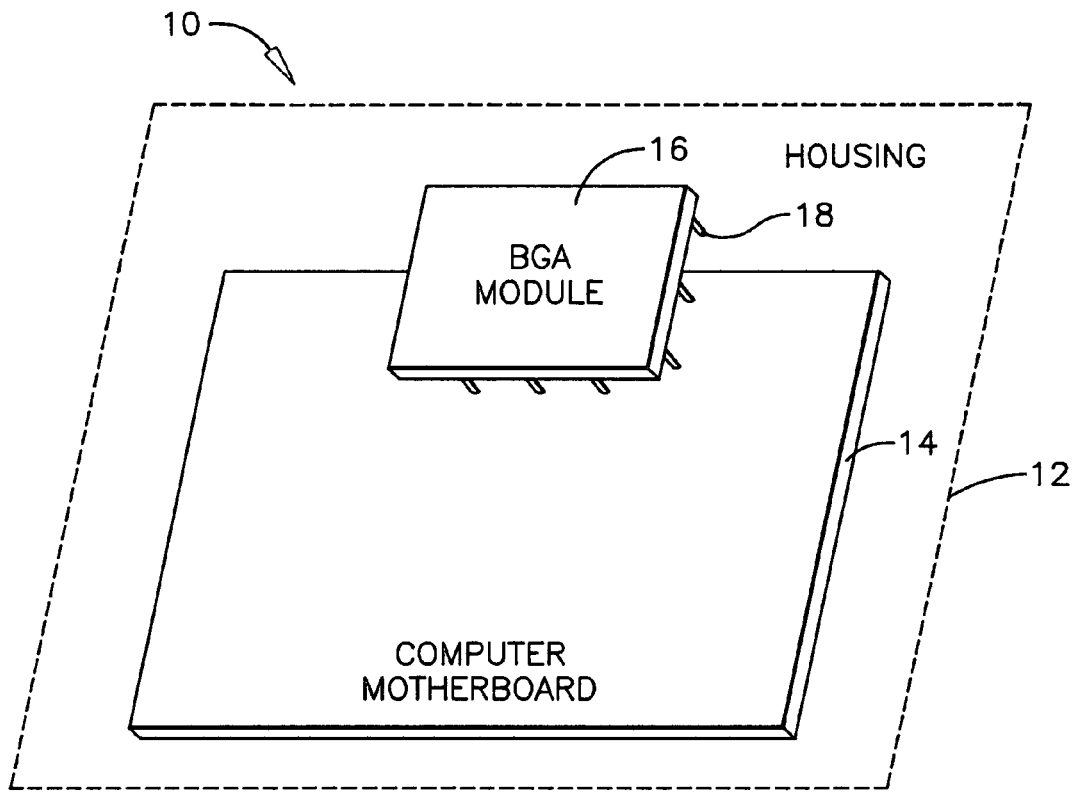
FIG. 1 is an exploded perspective view of a motherboard with BGA module.

Referring initially to FIG. 1, a system is shown, generally designated 10, which includes a portable housing 12 and a computer motherboard 14 supported therein. While the system 10 shown in FIG. 1 is a portable computing device such as a laptop computer, wireless telephone, or the like, and while reference is made to the motherboard 14 for illustration, the principles advanced herein apply to non-portable computers that may nonetheless be subject to mechanical shock and to circuit boards other than motherboards. Also, while BGA modules are discussed below, present principles apply to modules that are subject to shock other than BGA modules.

One or more ball grid array (BGA) modules 16 are mounted to the motherboard 14 using the above-referenced solder balls 18 on the module 16 in accordance with principles known in the art. The BGA module 16 shown in FIG. 1 may be any computer chip or other modular component that is mounted to the motherboard 14 using BGA mounting principles.

Figure 2:
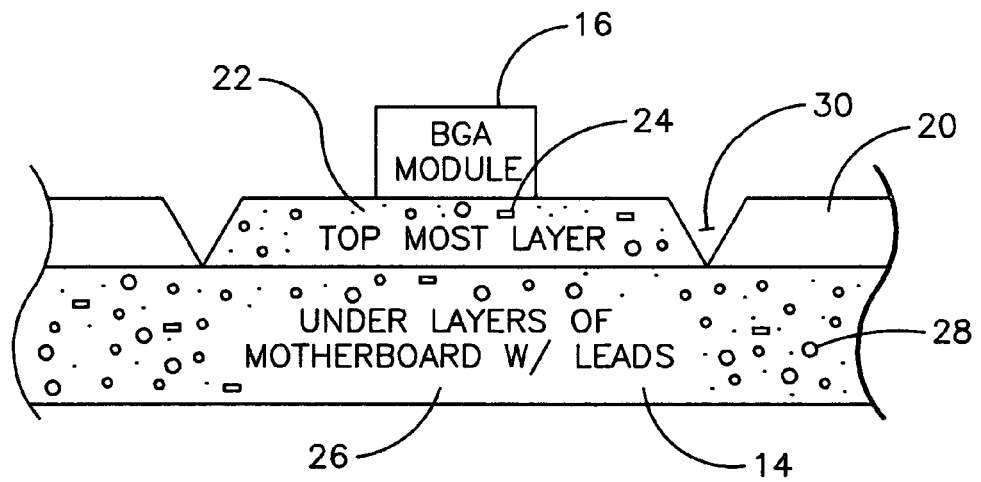
FIG. 2 is a side elevational view of the motherboard with BGA module.
Figure 4:
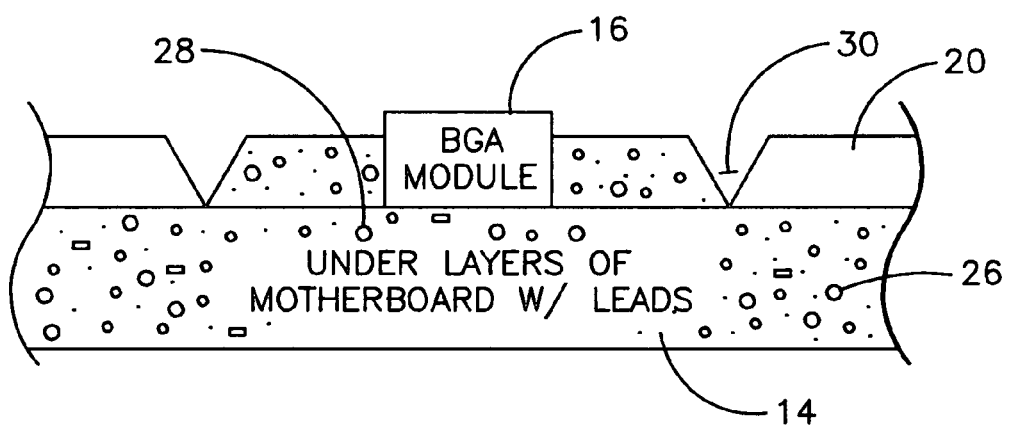
FIG. 4 is a side elevational view of an alternate motherboard with BGA module.

FIG. 2 shows that a topmost layer 20 is formed on the motherboard 14. The layer 20 is made of circuit board material. In the embodiment shown in FIG. 2, the volumetric regions 22 of the topmost layer 20 that lie under the intended location of a BGA module contain electrical leads 24, for the purpose of electrically connecting the solder balls 18 (FIG. 1) of the BGA module 16 to other components on the motherboard. Volumetric regions of the topmost layer 20 that lie outside the regions 22 preferably do not contain electrical leads. Alternatively, referring briefly to FIG. 4, the topmost layer 20 is not formed in areas between the intended locations of BGA modules and the motherboard 14, so that the BGA modules can be electrically connected to underlayers 26 of the motherboard 14 that contain electrical leads 28. In this case, no region of the topmost layer 20 need contain electrical leads.

Referring back to FIG. 2, in accordance with the present invention V-shaped channels 30 are formed (e.g., by cutting or molding) into the topmost layer 20 adjacent the BGA module 16 to impede mechanical stress from reaching the solder joints of the BGA module. As shown, each V-shaped channel 30 defines opposed walls that are oblique to each other and that extend down toward each other through the topmost layer 20. Less preferably, instead of a continuous V-shaped channel, a dashed, perforation-like cut can be used. In either case, a stress relied channel is formed.

Figure 3:
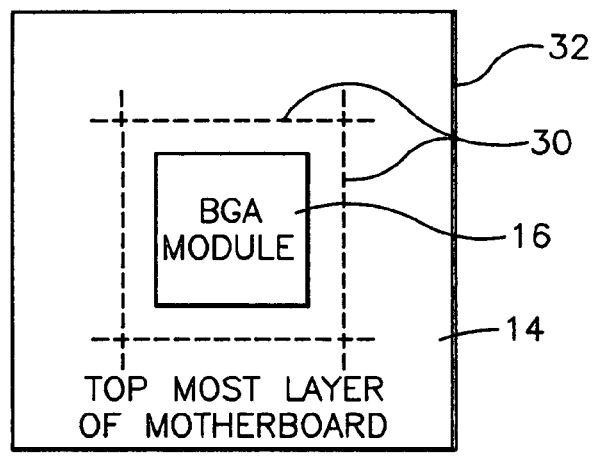
FIG. 3 is a top plan view of the motherboard with BGA module.

Moreover, as best shown in FIG. 3, V-shaped channels 30 preferably are formed between the BGA module 16 and each edge 32 of the motherboard 14 that borders the BGA module 16. Indeed, it is preferred that no BGA module be closer to an edge 32 of the motherboard 14 than an intervening V-shaped channel 30. In this way, mechanical stress that would otherwise propagate to solder joints that hold the BGA module 16 to the motherboard 14 is shielded from the solder joints by the V-shaped channels 30. In the embodiment shown in FIG. 3, in plan view V-shaped channels 30 may be formed along each motherboard edge 32 and parallel thereto, so that some V-shaped channels 30 are orthogonal to and may even cross other channels 30.

While the particular SYSTEM AND METHOD FOR DECREASING STRESS ON SOLDER HOLDING BGA MODULE TO COMPUTER MOTHERBOARD as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". It is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. Absent express definitions herein, claim terms are to be given all ordinary and accustomed meanings that are not irreconcilable with the present specification and file history.

What is claimed is:

1. A system comprising:
    a circuit board having a topmost layer;
    at least one module connected to the circuit board by plural balls, wherein
    at least one stress relief channel is formed into the topmost layer of the circuit board adjacent the module between the balls and an outside edge of the circuit board to impede mechanical stress from reaching at least portions of the module, wherein the stress relief channel is a V-channel defining opposed walls oblique to each other, the walls extending down toward each other through the topmost layer.

2. The system of claim 1, comprising plural channels.

3. The system of claim 1, wherein the circuit board is a computer motherboard having at least one layer below the topmost layer and supporting plural electrical leads and the module is a ball grid array (BGA) module attached to the motherboard by plural solder joints.

4. The system of claim 1, wherein the topmost layer bears electrical leads at least between the module and the circuit board.

5. The system of claim 1, wherein the topmost layer is substantially devoid of electrical connectors, the topmost layer not being formed in regions between the module and the circuit board.

6. A mobile computing device, comprising:
    a portable housing;
    at least one motherboard in the housing, the motherboard having a topmost layer;
    at least one module mounted on the motherboard at plural solder joints; and
    channel means juxtaposed with the motherboard for channeling stress away from the solder joints, the topmost layer not being formed in regions between the module and the motherboard.

7. The device of claim 6, wherein the channel means includes at least one V-shaped channel formed in the topmost layer.

8. The device of claim 7, wherein the V-shaped channel defines opposed walls oblique to each other, the walls extending down toward each other through the topmost layer.

9. The device of claim 7, wherein the motherboard is a computer motherboard having at least one layer below the topmost layer and supporting plural electrical leads and the module is a BGA module.

10. The device of claim 9, wherein the topmost layer bears electrical leads at least between the BGA module and the motherboard.

11. The device of claim 6, wherein the topmost layer is substantially devoid of electrical connectors.

12. A system comprising:
    a circuit board having a topmost layer;
    at least one module connected to the circuit board by plural balls, wherein
    at least one stress relief channel is formed into the topmost layer of the circuit board adjacent the module between the balls and an outside edge of the circuit board to impede mechanical stress from reaching at least portions of the module, wherein the stress relief channel is established by a dashed, perforation-like cut.

13. A system comprising:
    a circuit board having a topmost layer;
    at least one module connected to the circuit board by plural balls, wherein
    at least first and second stress relief channels are formed at least into the topmost layer of the circuit board adjacent the module between the balls and an outside edge of the circuit board to impede mechanical stress from reaching at least portions of the module, the first channel being orthogonal to the second channel.

14. The system of claim 13, wherein the first channel crosses the second channel.

* * * * *